United States Patent
Haynes et al.

(10) Patent No.: US 10,840,056 B2
(45) Date of Patent: Nov. 17, 2020

(54) MULTI-COLUMN SCANNING ELECTRON MICROSCOPY SYSTEM

(71) Applicant: KLA-Tencor Corporation, Milpitas, CA (US)

(72) Inventors: Robert Haynes, Pleasanton, CA (US); Aron Welk, Tracy, CA (US); Tomas Plettner, San Ramon, CA (US); John Gerling, Livermore, CA (US); Mehran Nasser Ghodsi, Hamilton, MA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 15/612,862

(22) Filed: Jun. 2, 2017

(65) Prior Publication Data
US 2018/0226219 A1 Aug. 9, 2018

Related U.S. Application Data

(60) Provisional application No. 62/454,715, filed on Feb. 3, 2017, provisional application No. 62/455,955, filed on Feb. 7, 2017.

(51) Int. Cl.
*H01J 37/10* (2006.01)
*H01J 37/28* (2006.01)
(Continued)

(52) U.S. Cl.
CPC .............. *H01J 37/10* (2013.01); *H01J 37/02* (2013.01); *H01J 37/14* (2013.01); *H01J 37/147* (2013.01);
(Continued)

(58) Field of Classification Search
None
See application file for complete search history.

(56) References Cited

U.S. PATENT DOCUMENTS

| | | | | |
|---|---|---|---|---|
| 4,419,580 A | * | 12/1983 | Walker | H01J 37/3007 250/396 R |
| 5,412,539 A | * | 5/1995 | Elwell | H01L 21/4853 174/255 |

(Continued)

FOREIGN PATENT DOCUMENTS

| | | | | |
|---|---|---|---|---|
| JP | 2002198294 A | * | 7/2002 | H01J 37/3174 |
| JP | 2013225395 A | | 10/2013 | |

OTHER PUBLICATIONS

International Search Report dated May 21, 2018 for PCT/US2018/016742.
U.S. Appl. No. 15/616,749, filed Jun. 7, 2017, Haynes et al.

*Primary Examiner* — Michael J Logie
(74) *Attorney, Agent, or Firm* — Suiter Swantz pc llo

(57) ABSTRACT

A multi-column scanning electron microscopy (SEM) system includes a column assembly, where the column assembly includes a first substrate array assembly and at least a second substrate array assembly. The system also includes a source assembly, the source assembly including two or more illumination sources configured to generate two or more electron beams and two or more sets of a plurality of positioners configured to adjust a position of a particular illumination source of the two or more illumination sources in a plurality of directions. The system also includes a stage configured to secure a sample, where the column assembly directs at least a portion of the two or more electron beams onto a portion of the sample.

19 Claims, 8 Drawing Sheets

(51) Int. Cl.
  *H01J 37/02* (2006.01)
  *H01J 37/14* (2006.01)
  *H01J 37/147* (2006.01)
  *H01J 37/285* (2006.01)

(52) U.S. Cl.
  CPC ...... *H01J 37/1472* (2013.01); *H01J 37/1474* (2013.01); *H01J 37/28* (2013.01); *H01J 37/285* (2013.01); *H01J 2237/1205* (2013.01); *H01J 2237/28* (2013.01)

(56) References Cited

U.S. PATENT DOCUMENTS

| | | | |
|---|---|---|---|
| 5,929,452 A * | 7/1999 | Yoshitake | B82Y 10/00 250/396 R |
| 6,125,522 A * | 10/2000 | Nakasuji | H01J 9/236 29/458 |
| 6,255,601 B1 | 7/2001 | Burkhart | |
| 6,617,587 B2 | 9/2003 | Parker et al. | |
| 6,617,595 B1 * | 9/2003 | Okunuki | G21K 1/08 250/398 |
| 6,660,116 B2 | 12/2003 | Wolf et al. | |
| 6,903,345 B2 * | 6/2005 | Ono | H01J 37/12 250/396 ML |
| 7,109,486 B1 | 9/2006 | Spallas et al. | |
| 7,335,895 B1 | 2/2008 | Spallas et al. | |
| 8,106,358 B2 | 1/2012 | Spallas et al. | |
| 8,513,619 B1 | 8/2013 | Nasser-Ghodsi et al. | |
| 8,618,513 B2 | 12/2013 | Plettner et al. | |
| 9,054,094 B2 | 6/2015 | Anthony et al. | |
| 9,607,806 B2 * | 3/2017 | Zonnevylle | H01J 37/3177 |
| 2003/0183778 A1 * | 10/2003 | Haraguchi | B82Y 10/00 250/492.2 |
| 2003/0189180 A1 * | 10/2003 | Hamaguchi | B82Y 10/00 250/492.3 |
| 2004/0016881 A1 | 1/2004 | Peng et al. | |
| 2004/0099811 A1 * | 5/2004 | Choi | B82Y 10/00 250/396 R |
| 2006/0131698 A1 * | 6/2006 | Jeong | B82Y 10/00 257/620 |
| 2006/0131752 A1 * | 6/2006 | Kim | B82Y 10/00 257/758 |
| 2007/0075257 A1 * | 4/2007 | Kametani | H01J 37/1477 250/396 R |
| 2008/0203317 A1 * | 8/2008 | Platzgummer | B82Y 10/00 250/396 R |
| 2009/0044610 A1 * | 2/2009 | Mackey | G01B 11/0641 73/104 |
| 2010/0187434 A1 * | 7/2010 | Platzgummer | H01J 37/045 250/396 R |
| 2010/0224778 A1 | 9/2010 | Muray et al. | |
| 2010/0276606 A1 * | 11/2010 | Baars | B82Y 10/00 250/396 R |
| 2010/0288938 A1 * | 11/2010 | Platzgummer | B82Y 10/00 250/396 R |
| 2011/0000699 A1 | 1/2011 | Bealka et al. | |
| 2011/0260040 A1 * | 10/2011 | Wieland | B82Y 10/00 250/208.2 |
| 2011/0261340 A1 * | 10/2011 | Wieland | B82Y 10/00 355/67 |
| 2011/0266418 A1 * | 11/2011 | Wieland | B82Y 10/00 250/208.2 |
| 2013/0037715 A1 | 2/2013 | Boughorbel et al. | |
| 2014/0318855 A1 | 10/2014 | Haynes et al. | |
| 2016/0225582 A1 | 8/2016 | Schultz et al. | |
| 2016/0247659 A1 * | 8/2016 | Oh | H01J 37/1477 |
| 2017/0025241 A1 * | 1/2017 | Li | H01J 37/28 |
| 2017/0148609 A1 * | 5/2017 | Cook | H01J 37/147 |
| 2018/0166254 A1 * | 6/2018 | Matsumoto | H01J 37/3026 |

* cited by examiner

MULTI-COLUMN SCANNING ELECTRON MICROSCOPY SYSTEM

CROSS-REFERENCE TO RELATED APPLICATIONS

The present application claims priority under 35 U.S.C. § 119(e) to U.S. Provisional Patent Application Ser. No. 62/454,715, filed Feb. 3, 2017, entitled METHOD OF COLUMN QUADRUPOLE OR OCTUPOLE ALIGNMENT, BONDING AND POST-MACHINING, naming Robert Haynes, Aron Welk, and Mehran Nasser Ghodsi as inventors; as well as U.S. Provisional Patent Application Ser. No. 62/455,955, filed Feb. 7, 2017, entitled COLUMN MANUFACTURING AND ASSEMBLY, naming Aron Welk, Robert Haynes, Tomas Plettner, and John Gerling as inventors; which are incorporated herein by reference in the entirety.

TECHNICAL FIELD

The present invention generally relates to wafer and photomask/reticle inspection and review and, more particularly, to a column assembly for a multi-column scanning electron microscopy system for use during wafer and photomask/reticle inspection and review.

BACKGROUND

The fabrication of semiconductor devices, such as logic and memory devices, typically includes processing a semiconductor device using a large number of semiconductor fabrication processes to form various features and multiple levels of the semiconductor devices. Some fabrication processes utilize photomasks/reticles to print features on a semiconductor device such as a wafer. As semiconductor device size becomes smaller and smaller, it becomes critical to develop enhanced inspection and review devices and procedures to increase the resolution, speed, and throughput of wafer and photomask/reticle inspection processes.

One inspection technology includes electron beam based inspection such as scanning electron microscopy (SEM). In some instances, scanning electron microscopy is performed by splitting a single electron beam into numerous beams and utilizing a single electron-optical column to individually tune and scan the numerous beams (e.g. a multi-beam SEM system). However, splitting a beam into an N number of lower current beams traditionally reduces the resolution of the multi-beam SEM system, as the N number of beams are tuned on a global level and individual images cannot be optimized. Additionally, splitting a beam into an N number of beams results in needing more scans and averages to obtain an image, which reduces the speed and throughput of the multi-beam SEM system. These issues increase with an increase in electron-optical column array size.

In other instances, scanning electron microscopy is performed via an SEM system which includes an increased number of electron-optical columns (e.g. a multi-column SEM system). Traditionally, these electron-optical columns are individual stacks of metal, ceramic rings, and electromagnets. These individual stacks are too large to be placed together with an ideal pitch for optimizing wafer, photomask/reticle scan speed, and cannot be miniaturized to allow for packing a significant number of electron-optical columns in a usable area, resulting in a limitation of the number of stacks in the multi-column SEM system (e.g. four stacks). Additionally, having individual stacks results in issues with electron-optical column matching, cross talk between the columns, and errant charging.

Further, size limitations exist when fabricating individual components such as multipole beam deflectors (e.g. quadrupole or octupole beam deflectors) elements for electron-optical columns as the electron-optical columns become smaller and smaller. One method of fabricating multipole beam deflectors includes fabricating an array of critical tolerance lens bores and radial slots in metal vias that segment and electrically isolate the poles of the multipole beam deflector. As the electron-optical column size decreases, multipole beam deflectors become more susceptible to fabrication errors that may potentially render the entire element unusable, which subsequently reduces the yield of the fabrication process. Another method of fabricating multipole beam deflectors includes pre-fabricating individual poles of the multipole beam deflectors and then bonding the individual poles together, either individually in pairs or via an alignment fixture. This method is limiting in terms of fabrication time and limited to select fabrication methods due to the close proximity of the individual poles. Additionally, this method is susceptible to errors in maintaining fabrication tolerances, as the tolerances would be affected by the relative placement errors of the individual poles of the multipole beam deflector. Further, maintaining at a desired critical tolerance when aligning and bonding the individual poles of the multipole beam deflector would require precise, miniscule tooling. This tooling may add a significant thermal mass during the bonding process, and the space required for the tooling may limit subsequent electron-optical column spacing.

Therefore, it would be advantageous to provide a system that cures the shortcomings described above.

SUMMARY

A substrate array is disclosed, in accordance with one or more embodiments of the present disclosure. In one embodiment, the substrate array includes a composite substrate formed from a plurality of substrate layers. In another embodiment, the composite substrate includes a plurality of holes. In another embodiment, the substrate array includes a plurality of electrical components embedded within the plurality of substrate layers. In another embodiment, the substrate array includes at least one ground bonding pad coupled to at least one of a top surface or a bottom surface of the composite substrate. In another embodiment, the substrate array includes at least one signal bonding pad coupled to at least one of the top surface or the bottom surface of the composite substrate. In another embodiment, the substrate array includes a plurality of column electron-optical elements. In another embodiment, the plurality of column electron-optical elements are positioned over the plurality of holes in the composite substrate. In another embodiment, each of the plurality of column electron-optical elements are bonded to a particular ground bonding pad and a particular signal bonding pad coupled to at least one of the top surface or the bottom surface of the composite substrate.

A multi-column scanning electron microscopy (SEM) system is disclosed, in accordance with one or more embodiments of the present disclosure. In one embodiment, the system includes a column assembly. In another embodiment, the column assembly includes a first substrate array assembly. In another embodiment, the column assembly includes at least a second substrate array assembly. In another embodiment, at least one of the first substrate array assembly or the at least a second substrate array assembly includes a substrate array. In another embodiment, the substrate array includes a composite substrate formed from a plurality of substrate layers. In another embodiment, the composite substrate includes a plurality of holes. In another embodiment, the substrate array includes a plurality of electrical components embedded within the plurality of substrate layers. In another embodiment, the substrate array includes at least one ground bonding pad coupled to at least one of a top surface or a bottom surface of the composite substrate. In another embodiment, the substrate array includes at least one signal bonding pad coupled to at least one of the top surface or the bottom surface of the composite substrate. In another embodiment, the substrate array includes a plurality of column electron-optical elements. In another embodiment, the plurality of column electron-optical elements are positioned over the plurality of holes in the composite substrate. In another embodiment, each of the plurality of column electron-optical elements are bonded to a particular ground bonding pad and a particular signal bonding pad coupled to at least one of the top surface or the bottom surface of the composite substrate.

In another embodiment, the system includes a source assembly. In another embodiment, the source assembly includes two or more electron beam sources configured to generate two or more electron beams. In another embodiment, each of the two or more electron beam sources is configured to generate an electron beam. In another embodiment, the source assembly includes two or more sets of a plurality of positioners. In another embodiment, each set of the plurality of positioners is configured to adjust a position of a particular illumination source of the two or more illumination sources in a plurality of directions. In another embodiment, the system includes a stage configured to secure a sample. In another embodiment, the column assembly is configured to direct at least a portion of the two or more electron beams onto a portion of the sample.

A method is disclosed, in accordance with one or more embodiments of the present disclosure. In one embodiment, the method may include, but is not limited to, forming a plurality of substrate arrays. In another embodiment, forming the substrate array of the plurality of substrate arrays may include, but is not limited to, embedding one or more components within a plurality of substrate layers. In another embodiment, forming the substrate array of the plurality of substrate arrays may include, but is not limited to, forming a composite substrate from the plurality of substrate layers. In another embodiment, forming the substrate array of the plurality of substrate arrays may include, but is not limited to, boring a plurality of holes in the composite substrate. In another embodiment, forming the substrate array of the plurality of substrate arrays may include, but is not limited to, coupling at least one ground bonding pad to at least one of a top surface or a bottom surface of the composite substrate. In another embodiment, forming the substrate array of the plurality of substrate arrays may include, but is not limited to, coupling at least one signal bonding pad to at least one of the top surface or the bottom surface of the composite substrate. In another embodiment, forming the substrate array of the plurality of substrate arrays may include, but is not limited to, bonding a plurality of column electron-optical elements to a particular ground bonding pad and a particular signal bonding pad coupled to at least one of the top surface or the bottom surface of the composite substrate. In another embodiment, each of the plurality of column electron-optical elements are positioned over the plurality of holes in the composite substrate.

In another embodiment, the method may include, but is not limited to, sorting the plurality of substrate arrays into a first substrate array assembly and at least a second substrate array assembly. In another embodiment, the method may include, but is not limited to, forming a column assembly from the first substrate array assembly and the at least a second substrate array assembly.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1-4, a multi-column scanning electron microscopy (SEM) system is described, in accordance with the present disclosure.

Embodiments of the present disclosure are directed to a multi-column SEM system including a column assembly. Additional embodiments of the present disclosure are directed to a method of fabricating a column assembly. Additional embodiments of the present disclosure are directed to substrate arrays for use in the electron-optical columns.

Figure 1:
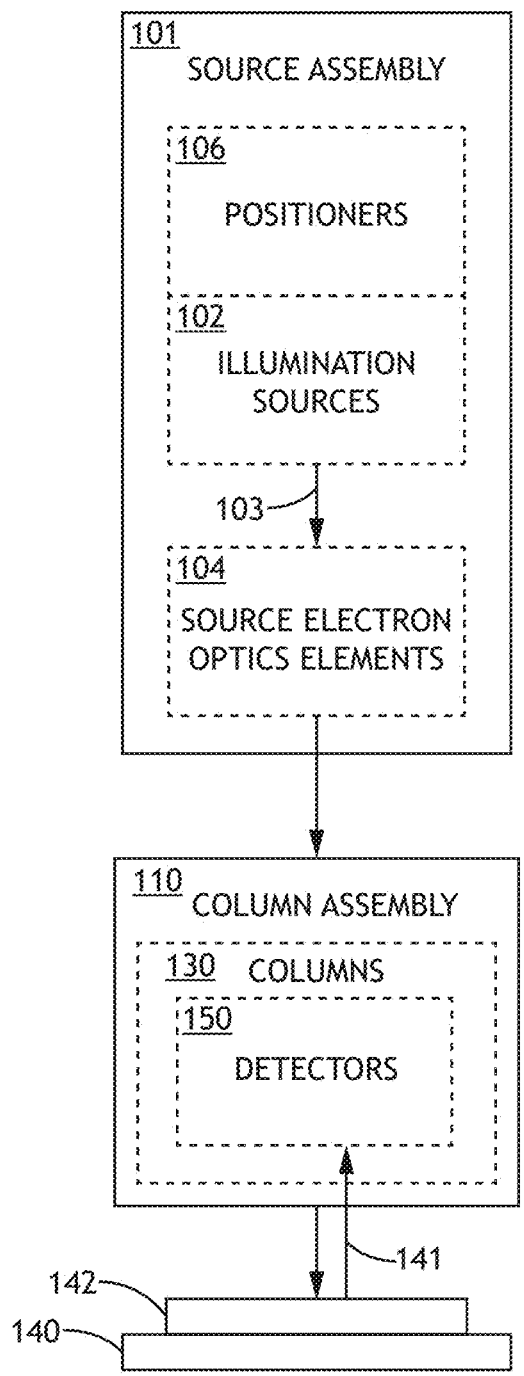
FIG. 1 is a simplified schematic view of a multi-column scanning electron microscopy (SEM) system equipped with a column assembly, in accordance with one or more embodiments of the present disclosure.

FIG. 1 illustrates an electron-optical system 100 for performing SEM imaging of a sample, in accordance with one or more embodiments of the present disclosure. In one embodiment, the electron-optical system 100 is a multi-column scanning electron microscopy (SEM) system. While the present disclosure largely focuses on an electron-optical arrangement associated with a multi-column SEM system, it is noted herein that this does not represent a limitation on the scope of the present disclosure and is provided merely for illustrative purposes. It is additionally noted herein that the embodiments described through the present disclosure may be extended to any electron-optical system configuration. It is further noted herein that the embodiments described throughout the present disclosure may be extended to any optical system configuration for microscopy and/or imaging.

In one embodiment, the system 100 includes a source assembly 101. In another embodiment, the source assembly 101 includes one or more illumination sources 102. For example, the one or more illumination beam sources 102 may include one or more electron beam sources 102. By way of another example, the one or more illumination beam sources 102 may include any illumination beam source known in the art. In another embodiment, the one or more electron beam sources 102 generate one or more electron beams 103 and direct the one or more electron beams 103 to one or more sets of source electron-optical elements 104. In another embodiment, the one or more electron beam sources 102 are coupled to one or more sets of positioners 106.

In another embodiment, the system 100 includes a column assembly 110 including one or more electron-optical columns 130. In another embodiment, the one or more sets of source electron-optical elements 104 direct the one or more electron beams 103 through the column assembly 110.

In another embodiment, the system 100 includes a stage 140 configured to secure a sample 142. In another embodiment, the column assembly 110 directs the one or more electron beams 103 to a surface of the sample 142. In another embodiment, the column assembly 110 includes one or more electron detectors 150 for detecting one or more electrons 141 emitted and/or scattered from the surface of the sample 142 in response to the electron beams 103.

The one or more electron beam sources 102 may include any electron beam source known in the art suitable for generating the one or more electron beams 103. For example, the one or more electron beam sources 102 may include multiple electron beam sources 102 for generating multiple electron beams 103, where each electron beam source 102 generates an electron beam 103. By way of another example, the one or more electron beam sources 102 may include a single electron beam source 102 that generates a single electron beam 103, where the single electron beam 103 is split into multiple electron beams 103 via one or more illumination source optical elements (e.g. an aperture array).

In another embodiment, the electron beam sources 102 include one or more electron emitters. For example, the one or more emitters may include, but are not limited to, one or more field emission guns (FEGs). For instance, the one or more FEGs may include, but are not limited to, one or more Schottky-type emitters. It is noted the diameter of the Schottky-type emitters may be selected to fit within the pitch spacing of the electron-optical columns 130, while providing a sufficient amount of clearance for alignment of the electron-optical columns 130. Additionally, the one or more FEGs may include, but are not limited to, one or more carbon nanotube (CNT) emitters, one or more nanostructured carbon film emitters, and/or one or more Muller-type emitters. By way of another example, the one or more emitters may include, but are not limited to, one or more photocathode emitters. By way of another example, the one or more emitters may include, but are not limited to, one or more silicon emitters.

In one embodiment, the source assembly 101 includes one or more sets of positioners 106 to actuate the electron beam sources 102. For example, the source assembly 101 may include multiple sets of positioners 106, where each set of positioners 106 is configured to actuate an electron beam source 102. By way of another example, the source assembly 101 may include a single set of positioners 106 configured to actuate multiple electron beam sources 102 (e.g. configured to actuate the multiple electron beam sources 102 on a global scale). In another embodiment, the one or more sets of positioners 106 are electrically coupled to the one or more electron beam sources 102. In another embodiment, the one or more sets of positioners 106 are mechanically coupled to the one or more electron beam sources 102.

In another embodiment, each set of positioners 106 includes one or more positioners 106 configured to translate an electron beam source 102 along one or more linear directions (e.g., x-direction, y-direction and/or z-direction). For example, three positioners 106 may be configured to translate an electron beam source 102. For instance, the three positioners may include, but are not limited to, a first positioner 106 configured to adjust the electron beam source 102 in an x-direction, a second positioner 106 configured to adjust the electron beam source 102 in a y-direction, and a third positioner 106 configured to adjust the electron beam source 102 in a z-direction. It is noted herein that the stacking order of the positioners within each of the one or more sets of positioners is provided purely for illustration, and is not to be understood as limiting for purposes of the present disclosure.

In one embodiment, the source assembly 101 includes one or more sets of source electron-optical elements 104. For example, the source assembly 101 may include a set of source electron-optical elements 104 for each of the multiple electron beams 103. In another embodiment, the one or more sets of source electron-optical elements 104 includes any electron-optical element known in the art suitable for focusing and/or directing at least a portion of the electron beams 103 to the column assembly 110. For example, the one or more sets of source electron-optical elements 104 may include, but are not limited to, one or more electron-optical lenses (e.g. one or more magnetic condenser lenses and/or one or more magnetic focus lenses). By way of another example, the one or more sets of source electron-optical elements 104 may include one or more extractors (or extractor electrodes). It is noted herein the one or more extractors may include any electron beam extractor configuration known in the art. For instance, the one or more extractors may include one or more planar extractors. Additionally, the one or more extractors may include one or more non-planar extractors. The use of planar and non-planar extractors in electron beam sources is generally described in U.S. Pat. No. 8,513,619, issued on Aug. 20, 2013, which is incorporated herein by reference in its entirety.

In another embodiment, the source assembly 101 does not include any source electron-optical elements 104. In this embodiment, the one or more electron beams 103 are focused and/or directed by one or more column electron-optical elements 210 positioned within each electron-optical column 130 of the column assembly 110. For example, the one or more column electron-optical elements 210 may include, but are not limited to, the one or more extractors described in detail previously herein. Therefore, the above description should not be interpreted as a limitation on the scope of the present disclosure but merely an illustration.

In one embodiment, the system 100 includes a column assembly 110. In another embodiment, the column assembly 110 includes one or more substrate array assemblies 120. In another embodiment, the one or more substrate array assemblies 120 include one or more substrate arrays 200. In another embodiment, the column assembly 110 includes an electron-optical column 130 for each of the electron beams 103. In another embodiment, the one or more electron-optical columns 130 are formed by bonding the one or more sets of column electron-optical elements 210 to the one or more substrate arrays 200. In another embodiment, the one or more electron-optical columns 130 direct at least a portion of the one or more electron beams 103 to the surface of the sample 142. It is noted the column assembly 110, the substrate array assemblies 120, the electron-optical columns 130, the substrate arrays 200, and the column electron-optical elements 210 are described in detail further herein.

In one embodiment, the stage 140 is configured to secure the sample 142. In another embodiment, the sample stage 140 is an actuatable stage. For example, the sample stage 140 may include, but is not limited to, one or more translational stages suitable for selectably translating the sample 142 along one or more linear directions (e.g., x-direction, y-direction and/or z-direction). By way of another example, the sample stage 140 may include, but is not limited to, one or more rotational stages suitable for selectively rotating the sample 142 along a rotational direction. By way of another example, the sample stage 140 may include, but is not limited to, a rotational stage and a translational stage suitable for selectably translating the sample along a linear direction and/or rotating the sample 142 along a rotational direction.

The sample 142 includes any sample suitable for inspection/review with electron-beam microscopy. In one embodiment, the sample includes a wafer. For example, the sample may include, but is not limited to, a semiconductor wafer. As used through the present disclosure, the term "wafer" refers to a substrate formed of a semiconductor and/or a non-semiconductor material. For instance, a semiconductor or semiconductor material may include, but is not limited to, monocrystalline silicon, gallium arsenide, and indium phosphide.

In another embodiment, the sample 142 emits and/or scatters electrons 141 in response to the electron beams 103. For example, the electrons 141 may be secondary electrons 141 and/or backscattered electrons 141.

In one embodiment, one or more electron detectors 150 are positioned within the one or more electron-optical columns 130, such that each electron-optical column 130 includes one or more electron detectors 150. The one or more electron detectors 150 may include any type of electron detector assembly known in the art capable of detecting the electrons 141. For example, the one or more detectors 150 may include, but are not limited to, one or more single-piece annular secondary electron detectors. By way of another example, the one or more detectors 150 may include, but are not limited to, one or more multi-piece annular secondary electron detectors. For instance, the one or more multi-piece annular secondary detectors may include, but are not limited to, one or more secondary electron quad arrays, one or more secondary electron octuplet arrays, and the like.

By way of another example, the electrons 141 may be collected and imaged using one or more micro-channel plates (MCP). It is noted herein that the use of MCP-based detectors to detect electrons is generally described in U.S. Pat. No. 7,335,895, issued on Feb. 26, 2008, which is incorporated herein by reference in its entirety. By way of another example, the electrons 141 may be collected and imaged using one or more PIN or p-n junction detectors such as a diode or a diode array. By way of another example, the electrons 141 may be collected and imaged using one or more avalanche photo diodes (APDs).

In another embodiment, the system 100 includes one or more components necessary to inspect a photomask/reticle instead of the sample 142.

In another embodiment, the system 100 includes a vacuum assembly to isolate the source assembly 101 from the column assembly 110 during operation of the system 100 and/or maintenance of the column assembly 110. In this regard, the amount of time required to bring the system 100 back up to operation is reduced. It is noted herein that the use of a vacuum assembly to generate differential pumping in a multi-column SEM system is generally described in U.S. Pat. No. 8,106,358, issued on Jan. 31, 2012, which is incorporated herein by reference in its entirety.

In another embodiment, the source assembly 101 includes ceramic standoffs to electrically and thermally isolate the one or more electron beam sources 102 from the respective set of positioners 106 and the surrounding structures of the system 100.

In another embodiment, the system 100 includes a controller (not shown). In one embodiment, the controller is communicatively coupled to one or more of components of system 100. For example, the controller may be communicatively coupled to the source assembly 101, components of the source assembly 101, the column assembly 110, the one or more electron-optical columns 130, components of the one or more electron-optical columns 130 (e.g. the one or more column electron-optical elements), and/or the stage 140. In this regard, the controller may direct any of the components of system 100 to carry out any one or more of the various functions described previously herein. For example, the controller may direct the one or more sets of positioners 106 coupled to the one or more electron beam sources 102 to translate the one or more electron beam sources 102 in one or more of an x-direction, a y-direction, and/or a z-direction to correct beam misalignment produced by any of the components of the source assembly 101, the components of the column assembly 101, the column assembly 110, the one or more electron-optical columns 130, components of the one or more electron-optical columns 130 (e.g. the one or more column electron-optical elements), and/or the stage 140.

In another embodiment, the controller includes one or more processors configured to execute program instructions suitable for causing the one or more processors to execute one or more steps described in the present disclosure. In one embodiment, the one or more processors of the controller may be in communication with a memory medium (e.g., a non-transitory storage medium) containing program instructions configured to cause the one or more processors of the controller to carry out various steps described throughout the present disclosure.

Figure 2A:
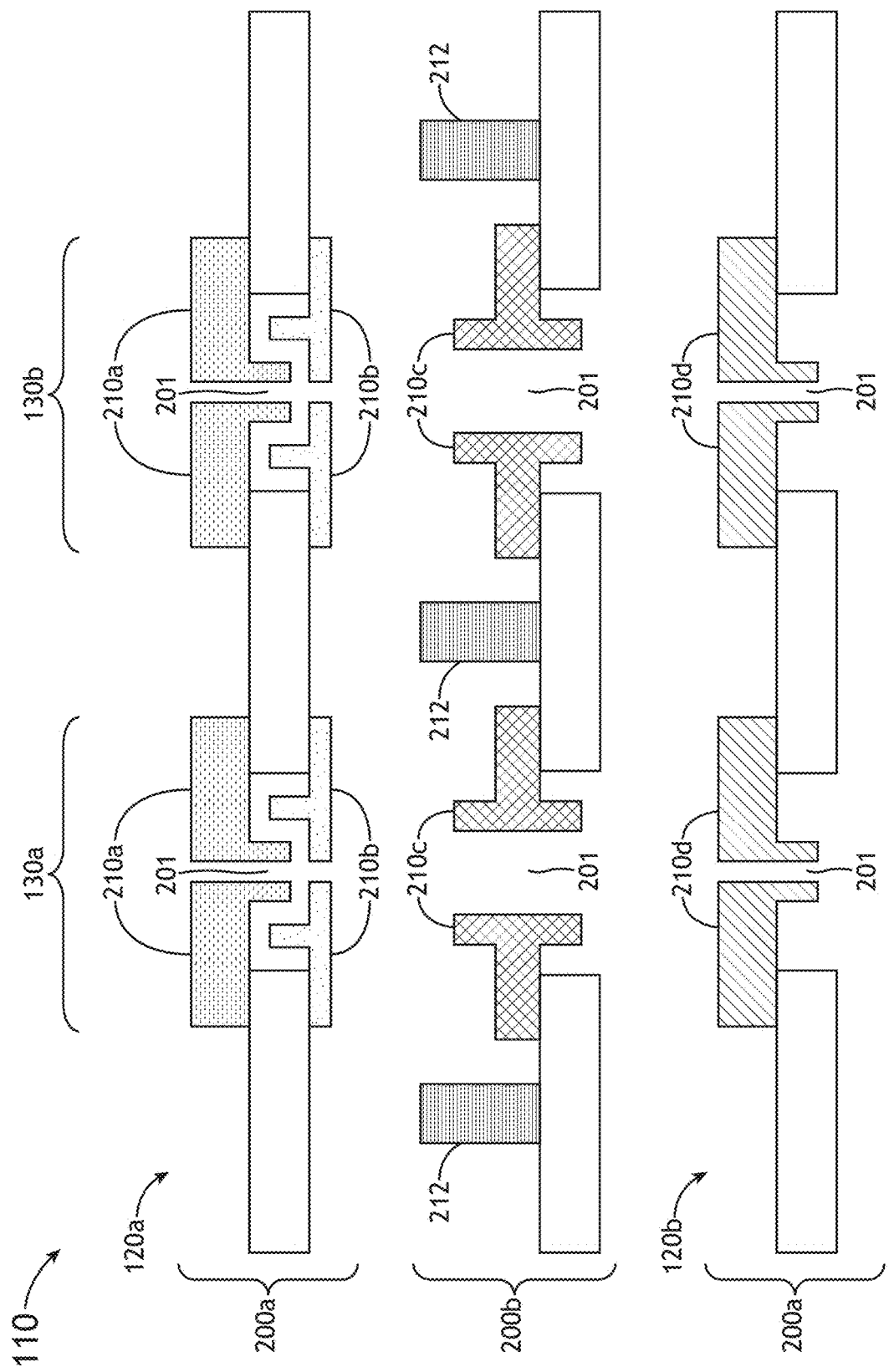
FIG. 2A is a cross-section view of a column assembly for a multi-column SEM system, in accordance with one or more embodiments of the present disclosure.

FIG. 2A illustrates a cross-section view of the column assembly 110, in accordance with one or more embodiments of the present disclosure.

In one embodiment, the column assembly 110 includes one or more substrate array assemblies 120. For example, the column assembly 110 may include a first substrate array assembly 120a and at least a second substrate array assembly 120b. In another embodiment, the one or more substrate array assemblies 120 each include one or more substrate arrays 200. For example, a substrate array assembly 120 may include a substrate array 200*a*. By way of another example, substrate array assembly 120 may include a first substrate array 200*a* and at least a second substrate array 200*b*. In another embodiment, the one or more substrate array assemblies 200 each include one or more holes 201.

In another embodiment, at least a portion of a top surface and/or a bottom surface of the one or more substrate arrays 200 is shielded by a metal layer to prevent errant charging between the one or more substrate arrays 200, between the one or more substrate arrays 200 and one or more components bonded to the one or more substrate arrays 200, and/or between the one or more components bonded to the one or more substrate arrays 200. In another embodiment, where a substrate array assembly 120 includes two or more substrate arrays 200, one or more metal shields 212 are positioned between the two or more substrate arrays 200. For example, the one or more metal shields 212 may be configured to prevent cross talk or errant charging between the one or more substrate array assemblies 120 and/or components of the one or more substrate array assemblies 120 in the column assembly 110.

In another embodiment, the one or more sets of column electron-optical elements 210 are bonded to the substrate arrays 200 over the one or more holes 201. For example, at least some of the one or more sets of column electron-optical elements 210 may include one or more three-dimensional column electron-optical elements 210. By way of another example, the one or more sets of column electron-optical elements 210 may include, but are not limited to, one or more detectors 150, one or more gun multipole beam deflectors, one or more extractors, one or more magnetic condenser lenses, one or more gun condenser lenses, one or more anodes, one or more upper beam deflectors, one or more lower beam deflectors, one or more dynamic focus lenses, and/or one or more magnetic focus lenses. It is noted the multipole beam deflectors are described in detail further herein.

In another embodiment a first column electron-optical element 210 is bonded to a top surface or a bottom surface of at least some of the one or more substrate arrays 200. In another embodiment, a first and a second column electron-optical element 210 is bonded to a top surface and a bottom surface, respectively, of at least some of the one or more substrate arrays 200.

It is noted herein that bonding electron-optical elements to substrate arrays to form a column assembly is generally described in U.S. Pat. No. 7,109,486, issued on Sep. 19, 2006, which is incorporated herein by reference in its entirety.

In another embodiment, the column assembly 110 includes one or more electron-optical columns 130. For example, the column assembly 110 may include a first electron-optical column 130*a* and at least a second electron-optical column 130*b*. By way of another example, the column assembly 110 may include, but is not limited to, 2 to 60 electron-optical columns 130. In another embodiment, the column assembly 110 includes an electron-optical column 130 for each of the one or more electron beams 103. In another embodiment, the one or more electron-optical columns 130 direct at least a portion of the electron beams 103 to the surface of the sample 142.

In another embodiment, the one or more electron-optical columns 130 are formed by the one or more sets of column electron-optical elements 210. For example, an electron-optical column 130 may be formed by a set of column electron-optical elements 210 including, but not limited to, a first element 210*a*, a second element 210*b*, a third element 210*c*, and at least a fourth element 210*d*. In another embodiment, an electron-optical column 130 is formed from a set of column electron-optical elements 210 for each of the one or more electron beams 103.

In one embodiment, the one or more substrate arrays 200 are grouped into the first substrate array assembly 120*a* and the at least a second substrate array assembly 120*b*. In another embodiment, one or more tolerance characteristics of the one or more substrate array assemblies 200 are inspected prior to grouping the one or more substrate arrays 200 into the first substrate array assembly 120 and the at least a second substrate array assembly 120*b*. For example, the pitch spacing of the one or more substrate arrays 200 may be inspected for the required tolerances. For instance, pitch spacing tolerance may include one or more single-digit micron feature tolerances.

In one embodiment, the one or more substrate arrays 200 of the first substrate array assembly 120*a* are arranged into a first substrate array stack. In another embodiment, the first substrate array stack is mounted in a first frame. In another embodiment, the one or more substrate arrays 200 of the at least a second substrate array assembly 120*b* are arranged into at least a second substrate array stack. In another embodiment, the at least a second substrate array stack is mounted in at least a second frame. In another embodiment, the first frame and the at least a second frame are coupled to form the column assembly 110.

In another embodiment, one or more alignment errors are reduced via a least square best fit alignment process when performing at least one of arranging the one or more substrate arrays 200 of the first substrate array assembly 120*a* into the first substrate array stack, arranging the one or more substrate arrays 200 of the at least a second substrate array assembly 120*b* into the at least a second substrate array stack, and/or coupling together the first frame and the at least a second frame. For example, the one or more alignment errors may include, but is not limited to, an offset distance in an x-direction, an offset distance in a y-direction, and/or an offset rotation angle.

In one embodiment, the one or more substrate arrays 200 of the first substrate array assembly 120*a* are arranged into a first bonded substrate array stack. In another embodiment, the one or more substrate arrays 200 of the at least a second substrate array assembly 120*b* are arranged into at least a second bonded substrate array stack. In another embodiment, the first bonded substrate array stack and the at least a second bonded substrate array stack are bonded to form the column assembly 110.

In another embodiment, one or more alignment errors are reduced via a least square best fit alignment process when performing at least one of arranging the one or more substrate arrays 200 of the first substrate array assembly 120*a* into the first bonded substrate array stack, arranging the substrate arrays 200 of the at least a second substrate array assembly 120*b* into the at least a second bonded substrate array stack, and/or bonding the first bonded substrate array stack and the at least a second bonded substrate array stack. For example, the one or more alignment errors may include, but is not limited to, an offset distance in an x-direction, an offset distance in a y-direction, and/or an offset rotation angle.

In one embodiment, the one or more substrate arrays 200 of the first substrate array assembly 120*a* are arranged into a first substrate array stack. In another embodiment, the first substrate array stack is mounted in a frame. In another embodiment, the one or more substrate arrays 200 of the at least a second substrate array assembly 120b are arranged into at least a second substrate array stack. In another embodiment, the at least a second substrate array stack is mounted in the same frame.

In another embodiment, one or more alignment errors are reduced via a least square best fit alignment process when performing at least one of arranging the one or more substrate arrays 200 of the first substrate array assembly 120a into the first substrate array stack or arranging the one or more substrate arrays 200 of the at least a second substrate array assembly 120b into the at least a second substrate array stack. For example, the one or more alignment errors may include, but is not limited to, an offset distance in an x-direction, an offset distance in a y-direction, and/or an offset rotation angle.

Figure 2B:
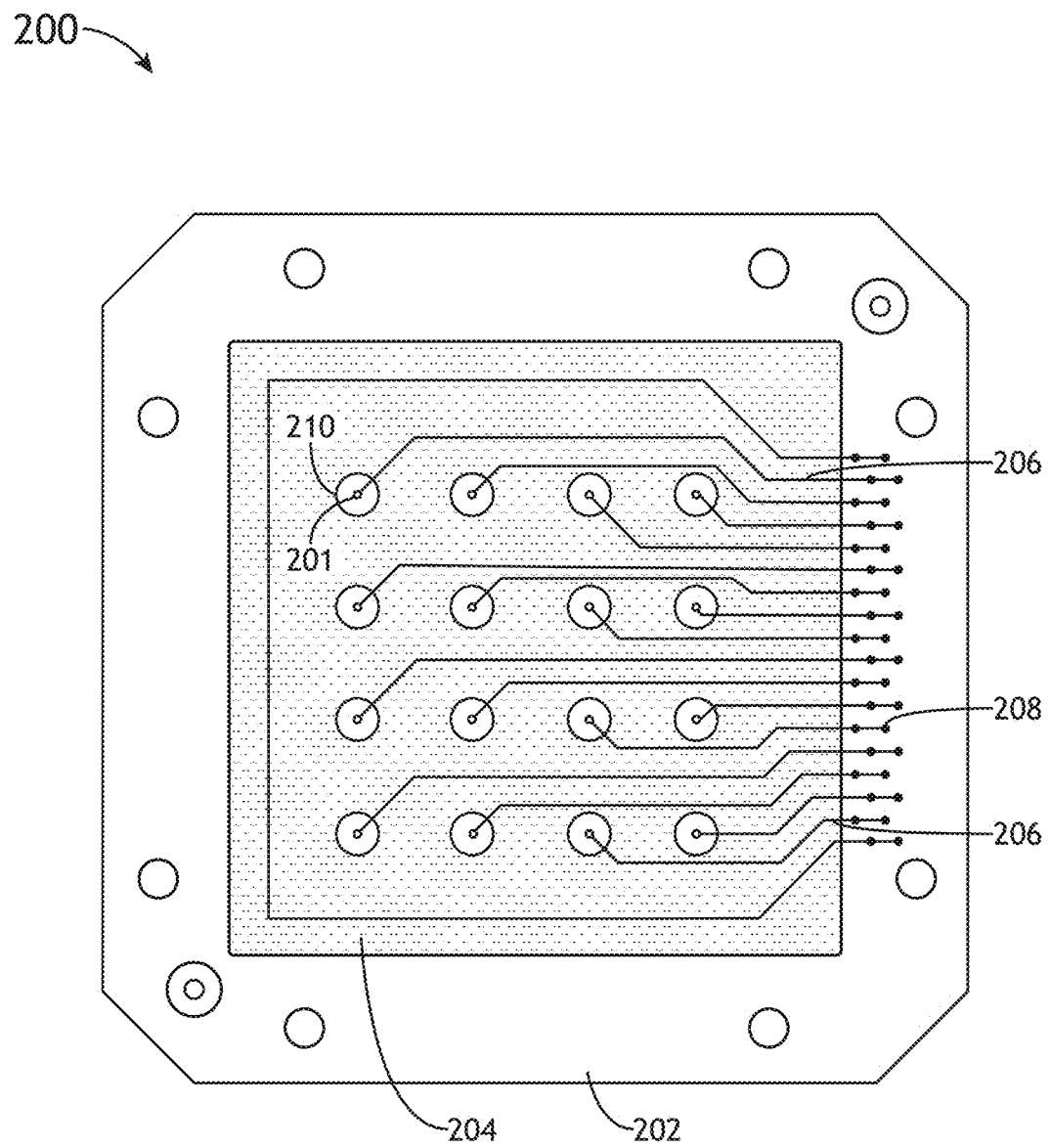
FIG. 2B is a substrate array for a column assembly, in accordance with one or more embodiments of the present disclosure.
Figure 2C:
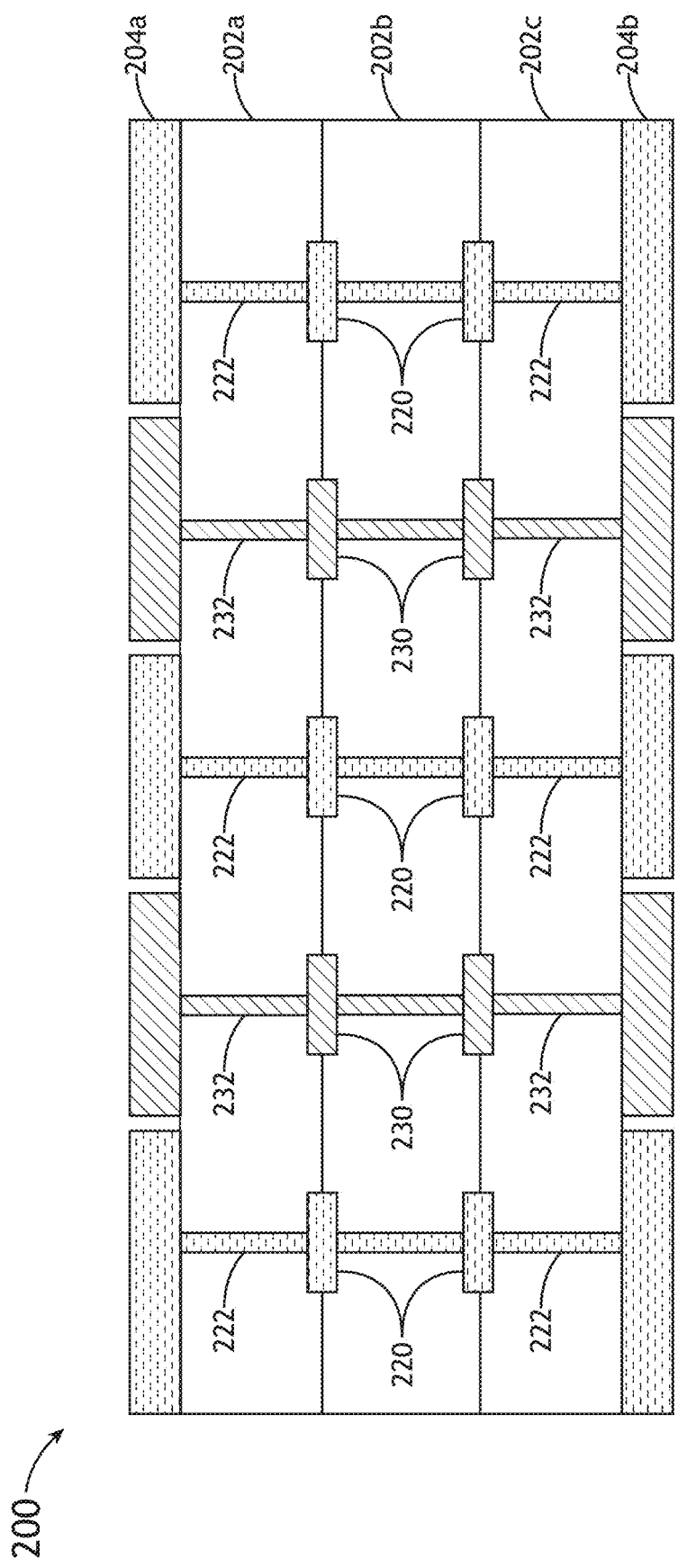
FIG. 2C is a cross-section view of a substrate array for a column assembly, in accordance with one or more embodiments of the present disclosure.

FIGS. 2B and 2C illustrate a substrate array 200 of the one or more substrate arrays, in accordance with one or more embodiments of the present disclosure.

In one embodiment, the substrate array 200 includes a composite layer 202 with one or more holes 201. In another embodiment, the composite layer 202 is formed from one or more substrate layers. For example, the composite layer 202 may include, but is not limited to, a first substrate layer 202a, a second substrate layer 202b, and at least a third substrate layer 202c. In another embodiment, the one or more substrate layers are fabricated from a co-fired ceramic. In another embodiment, the composite layer 200 is formed from the plurality of substrate layers via a fabrication process. For example, the fabrication process may include, but is not limited to, pressing together the plurality of substrate layers, sintering together the plurality of substrate layers, and/or joining together the plurality of substrate layers via a co-firing process.

In another embodiment, the substrate array 200 includes one or more electrical contact layers 204 coupled to one or more of the top surface and/or the bottom surface of the composite layer 202. For example, the substrate array 200 may include a contact layer 204a with one or more electrical contacts coupled to the top surface of the composite layer 202. By way of another example, the substrate array 200 may include a contact layer 204b with one or more electrical contacts coupled to the bottom surface of the composite layer 202. In another embodiment, the one or more electrical contacts include one or more ground bonding pads (e.g. ground contact pads). In another embodiment, the one or more electrical contacts include one or more signal bonding pads (e.g. signal contact pads), where the one or more signal bonding pads are electrically isolated from the one or more ground bonding pads.

In another embodiment, the one or more contact layers 204 include a metalized coating or a metal plate. In another embodiment, the one or more contact layers 204 are coupled to the top surface and/or the bottom surface of the composite layer 202 via a fabrication process. For example, the fabrication may include, but is not limited to, a pressing process, a sintering process, an adhesion process (e.g., joining via an epoxy), a thick-film process, and/or a thin-film process. In another embodiment, the one or more contact layers 204 are configured to prevent errant charging and negative beam interaction.

In another embodiment, the composite layer 202 includes one or more electrical components 206 embedded within the one or more substrate layers. In another embodiment, the one or more electrical components 206 include one or more ground traces 220, one or more ground vias 222, one or more signal traces 230, and/or one or more signal vias 232. In another embodiment, the one or more electrical components 206 are embedded within the plurality of substrate layers prior to forming the composite layer 202.

In another embodiment, the one or more ground traces 220 are electrically coupled to the one or more ground bonding pads in the one or more contact layers 204 with the one or more ground vias 222. In another embodiment, the one or more signal traces 230 are electrically coupled to the one or more signal bonding pads in the one or more contact layers 204 with the one or more signal vias 232.

It is noted herein that although both the one or more ground vias 222 and the one or more signal vias 232 are shown within the same cross-section of the substrate array 200, the one or more ground vias 222 and the one or more signal vias 232 may be arranged such that a cross-section of the substrate array 200 would only include either the one or more ground vias 222 or the one or more signal vias 232. It is additionally noted herein that although both the one or more ground bonding pads and the one or more signal bonding pads in the one or more contact layers 204 are shown in the same cross-section of the substrate array 200, the one or more ground bonding pads and the one or more signal bonding pads in the one or more contact layers 204 may be arranged such that a cross-section of the substrate array 200 would only include either the one or more ground bonding pads or the one or more signal bonding pads. Therefore, the above description should not be interpreted as a limitation on the scope of the present disclosure but merely an illustration.

In another embodiment, the one or more electrical components 206 are electrically coupled to one or more electrical contact pads 208. For example, the one or more ground traces 220 may be electrically coupled to one or more ground contact pads 208. By way of another example, the one or more signal traces 230 may be electrically coupled to one or more signal contact pads 208.

In another embodiment, the one or more electrical contact pads 208 are located on a portion of the top surface and/or the bottom surface of the composite layer 202 not shielded by a contact layer 204 (e.g. an unshielded portion of the substrate array 200). It is noted herein, however, that a majority of the top surface and/or the bottom surface of the composite layer 202 is shielded to prevent errant charging.

In one embodiment, one or more column electron-optical elements 210 are bonded to the substrate array 200. For example, the one or more column electron-optical elements 210 may be bonded to the top surface and/or the bottom surface of the substrate array 200. By way of another example, the one or more column electron-optical elements 210 may be bonded to a particular ground bonding pad and a particular signal bonding pad coupled to the top surface and/or the bottom surface of the substrate array 200. In another embodiment, the one or more column electron-optical elements 210 are bonding to the substrate array 200 via a bonding process. For example, the bonding process may include, but is not limited to, a soldering process, a brazing process, or an adhesion process (e.g. joining via an epoxy).

In another embodiment, at least some of the one or more column electron-optical elements 210 are fully fabricated prior to being bonded to the substrate array 200. In another embodiment, at least some of the one or more column electron-optical elements 210 are partially fabricated via a first set of fabrication process prior to being bonded to the substrate array 200, and fully fabricated via a second set of fabrication processes after being bonded to the substrate array 200. It is noted the first set of fabrication processes and the second set of fabrication processes are described in detail further herein.

In another embodiment, the one or more column electron-optical elements 210 are inspected to meet individual tolerances. For example, the individual tolerances may include one or more single-digit micron feature tolerances. In another embodiment, the one or more column electron-optical elements 210 are aligned while being bonded to the substrate array 200 via an alignment process. For example, the alignment process may include, but is not limited to, an alignment process to align a plurality of lithographic target features or an optical overlay alignment process.

Figure 3A:
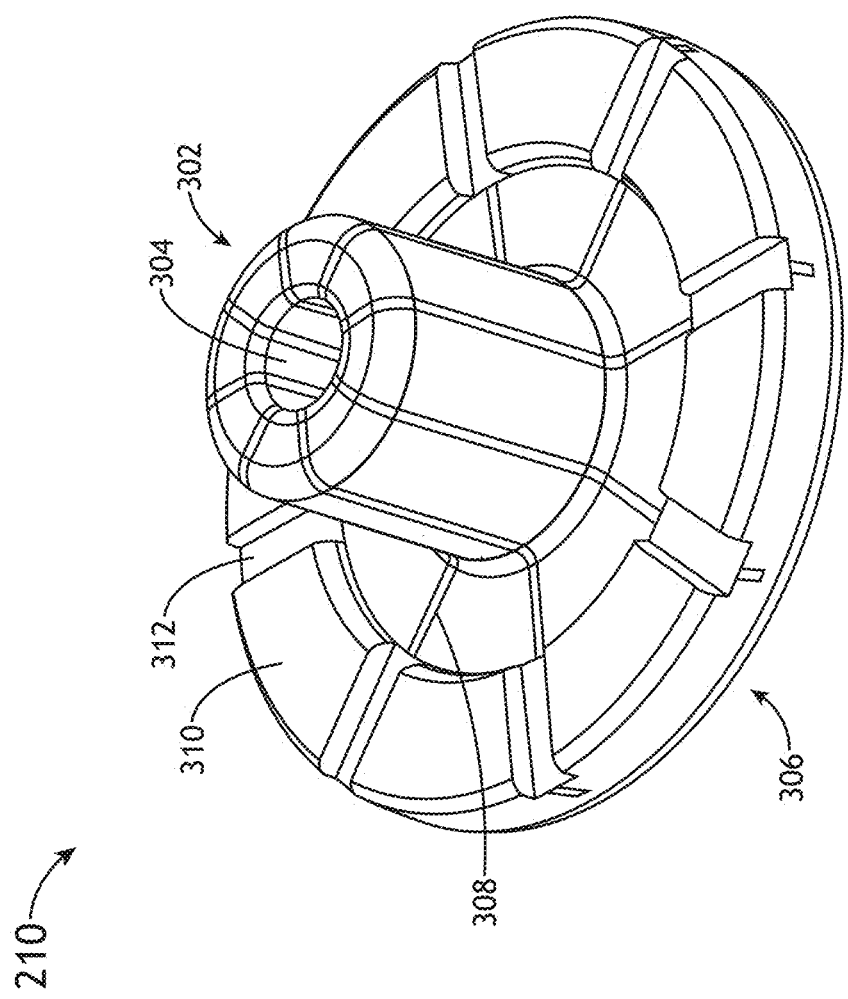
FIG. 3A is an isometric view of a partially-fabricated multipole beam deflector, in accordance with one or more embodiments of the present disclosure.
Figure 3C:
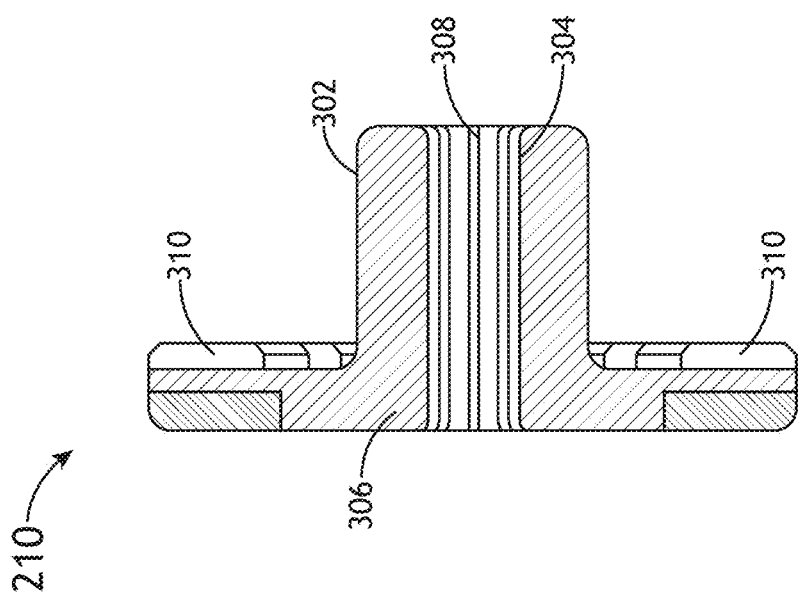
FIG. 3C is a cross-section view of a partially-fabricated multipole beam deflector, in accordance with one or more embodiments of the present disclosure.
Figure 3B:
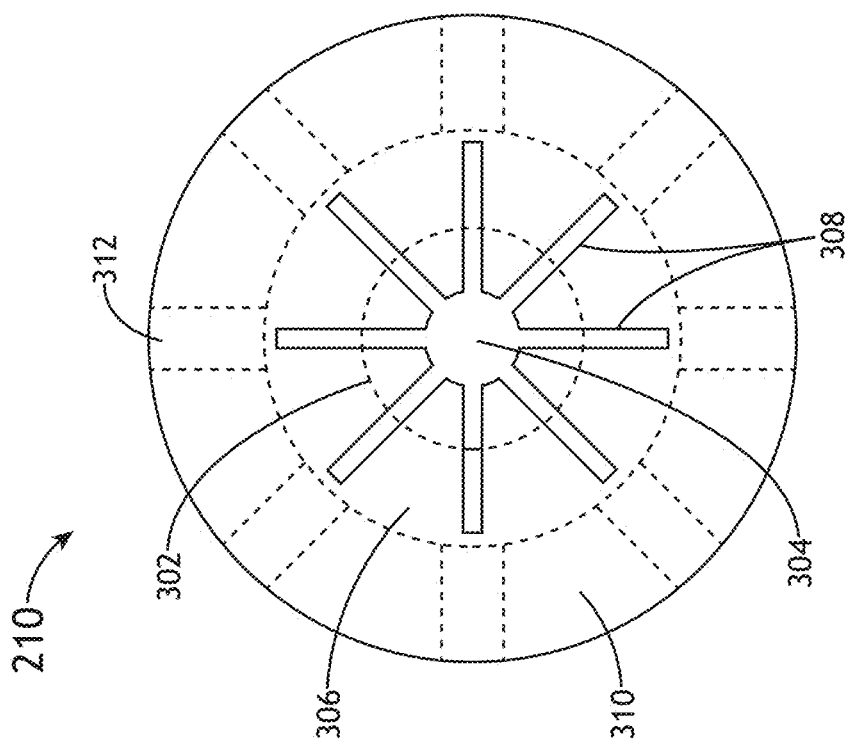
FIG. 3B is a bottom view of a partially-fabricated multipole beam deflector, in accordance with one or more embodiments of the present disclosure.

FIGS. 3A-3C illustrate a partially-fabricated multipole beam deflector 210, in accordance with one or more embodiments of the present disclosure.

In one embodiment, the multipole beam deflector 210 includes a barrel portion 302 and a disc portion 306. For example, the barrel portion 302 may be inserted into a hole of a substrate array 200 when the multipole beam deflector 210 is bonded to the substrate array 200.

In another embodiment, the multipole beam deflector 210 includes a hole 304 bored through the top of the barrel portion 302 and the bottom of the disc portion 306. For example, the hole 304 may allow an electron beam 103 to pass through the multipole beam deflector 210. In another embodiment, the hole 304 has one or more critical tolerances. For example, the one or more critical tolerances may include, but are not limited to, a bore size and/or a bore shape.

In another embodiment, the multipole beam deflector 210 includes one or more slots 308. For example, the one or more slots 308 may be partially cut into the multipole beam deflector 210, such that the one or more slots 308 cut through the barrel portion 302 and the disc portion 306 of the multipole beam deflector 210 without extending to the edge of the disc portion 306. It is noted herein that if the one or more slots 308 extended to the edge of the disc portion 306, the multipole beam deflector 210 would be segmented into multiple individual beam deflector poles.

In another embodiment, the multipole beam deflector 210 includes a raised region 310 on an outer area of the disc portion 306. For example, the raised region 310 may offset an inner area of the disc portion 306 from the top surface or the bottom surface of the substrate array 200 at a distance equal to the height of the raised region 310. In another embodiment, the multipole beam deflector 210 includes one or more grooves 312 in the raised region 310. For example, the one or more grooves 312 in the raised region 310 may be work areas for one or more post-bonding fabrication processes, to ensure the one or more post-bonding fabrication processes do not damage (or otherwise interfere with the operation of) the substrate array 200.

Figure 3D:
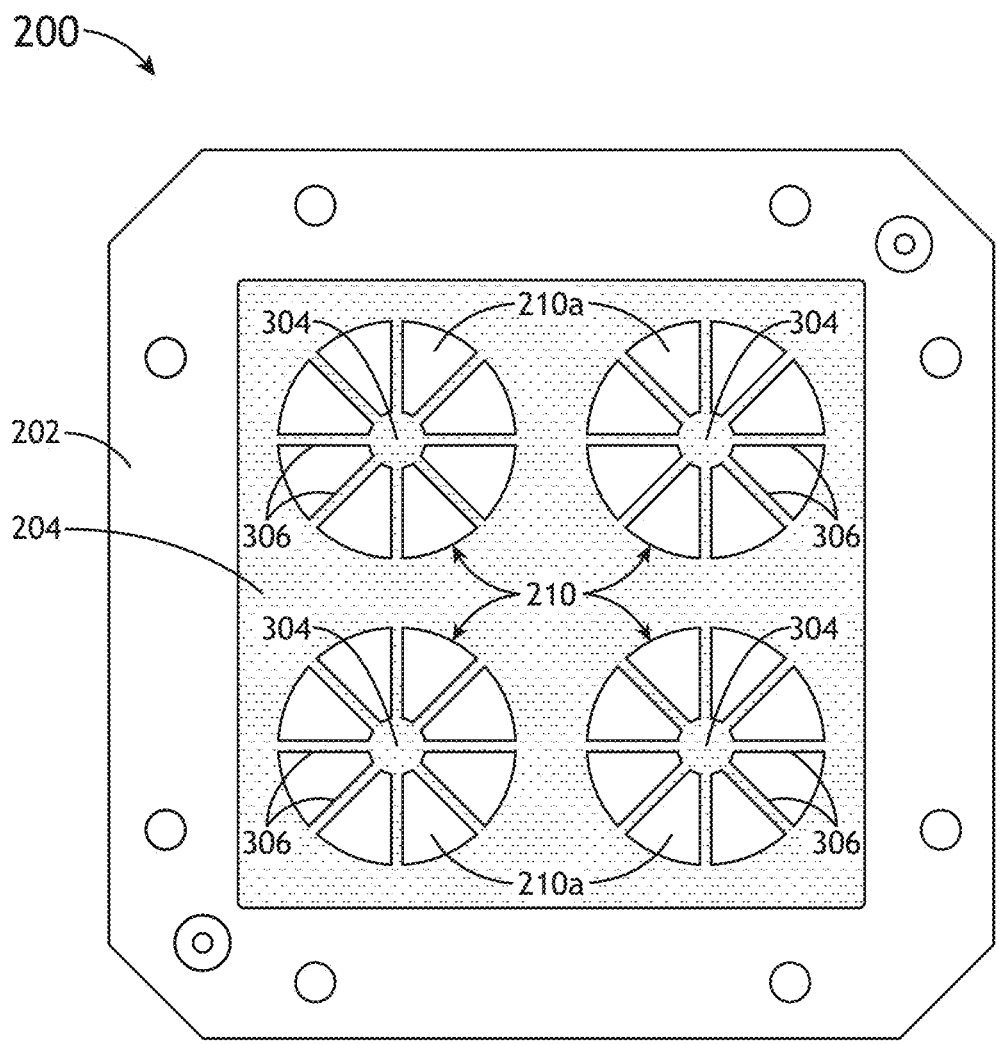
FIG. 3D is a substrate array equipped with fully-fabricated multipole beam deflectors, in accordance with one or more embodiments of the present disclosure.

FIG. 3D illustrates a set of fully-fabricated multipole beam deflectors bonded to a substrate array 200, in accordance with one or more embodiments of the present disclosure.

In one embodiment, one or more partially-fabricated multipole beam deflectors 210 are bonded to the contact layers 204 of the substrate array 200. In another embodiment, the one or more slots 308 are extended to the edge of the one or more partially-fabricated multipole beam deflectors 210 at the one or more grooves 312 via a cutting process, where the cutting process segments the one or more partially-fabricated multipole beam deflectors 210 into individual beam deflector poles 210a, thus fully-fabricating the one or more multipole beam deflectors 210. For example, the one or more partially-fabricated multipole beam deflectors 210 may include, but are not limited to, 2-12 slots 308, which segment the partially-fabricated multipole beam deflectors 210 into 4-24 individual beam deflector poles (e.g. resulting in a quadrupole beam deflector, an octupole beam deflector, and the like) when extending to the edge of the multipole beam deflectors 210 to fully fabricate the one or more multipole beam deflectors 210

Advantages of the embodiments of the present disclosure include fabricating and aligning multi-column SEM systems with decreased pitch spacing and tighter tolerances. Advantages of the present disclosure also include forming better-matching substrate array assemblies by inspecting substrate arrays and sorting the substrate arrays based on inspection results. Advantages of the present disclosure also include improving the yield of fabricated electron-optical elements by partially fabricating electron-optical elements via a first set of fabrication processes, inspecting the partially-fabricated electron-optical elements, sorting the partially-fabricated electron-optical elements to matched sets based on inspection results, aligning the matched sets of partially-fabricated electron-optical elements, bonding the partially-fabricated electron-optical elements to a substrate array, and fully fabricating the bonded electron-optical elements via a second set of fabrication processes. Advantages of the present disclosure also include preventing charging and reducing cross talk between multiple electron-optical column beam signals.

Figure 4:
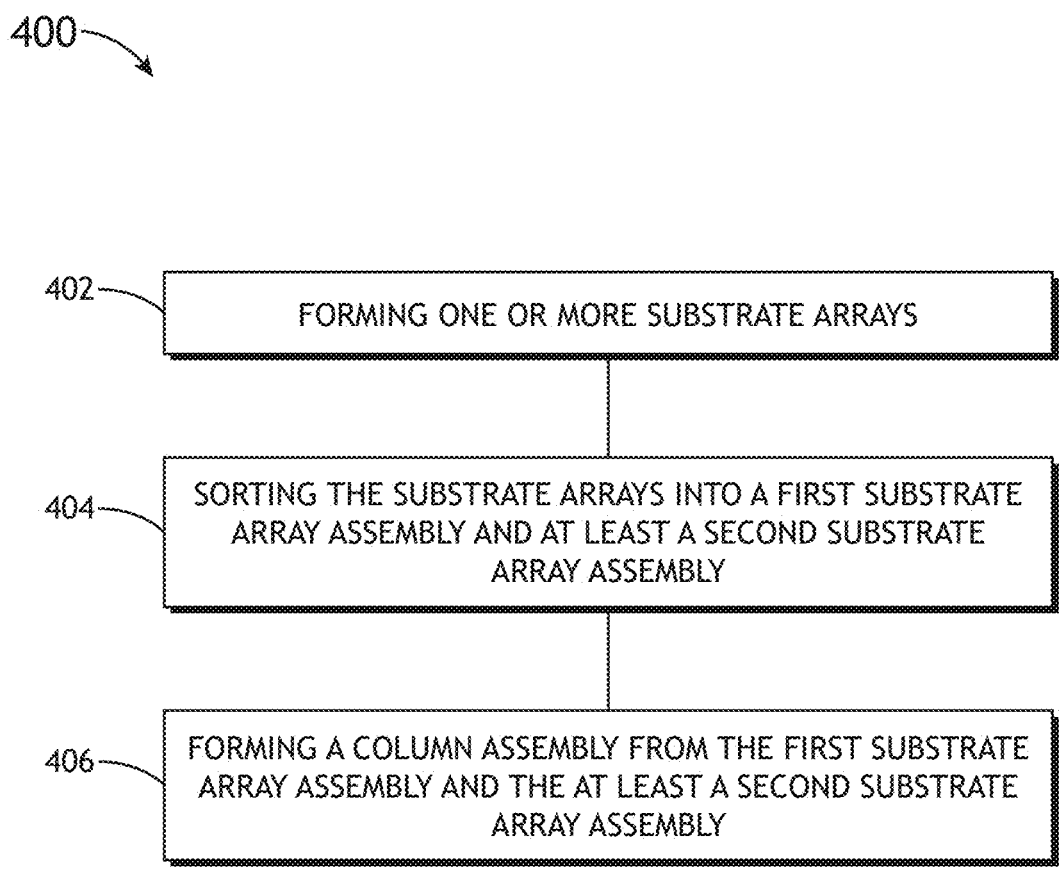
FIG. 4 is a method for fabricating a column assembly for a multi-column SEM system, in accordance with one or more embodiments of the present disclosure.

FIG. 4 illustrates a process flow diagram depicting a method 400 to fabricate a column assembly 110 for a multi-column SEM system 100. The method may also include any other step(s) that can be performed by the output acquisition subsystem and/or computer subsystem(s) or system(s) described herein.

In step 402, one or more substrate arrays 200 are formed. In one embodiment, forming the one or more substrate arrays 200 includes embedding one or more electrical components 206 within one or more substrate layers 202, where at least some of the one or more the substrate layers 202 are fabricated from a co-fired ceramic. In another embodiment, the one or more electrical components 206 include one or more ground traces 220, one or more signal traces 230, one or more ground vias 222, and/or one or more signal vias 232.

In another embodiment, forming the one or more substrate arrays 200 includes forming a composite substrate 202 from the plurality of substrate layers. For example, forming a composite substrate from the substrate layers may include, but is not limited to, pressing together the substrate layers, sintering together the substrate layers, or joining together the substrate layers via a co-firing process. In another embodiment, forming the one or more substrate arrays 200 includes boring a plurality of holes 201 in the composite substrate 202.

In another embodiment, forming the one or more substrate arrays 200 includes coupling one or more contact layers 204 to at least one of the top surface or the bottom surface of the composite substrate 202, where the one or more contact layers 204 include a metalized coating and/or a metal plate. For example, coupling the one or more contact layers 204 may include a pressing process, a sintering process, an adhesion process, a thick-film process, and/or a thin-film process. For instance, the adhesion process may be, but is not limited to, joining with an epoxy. In another embodiment, the one or more contact layers 204 include one or more ground bonding pads. For example, the one or more ground traces 220 may be electrically coupled to the one or more ground bonding pads with the one or more ground vias 222. In another embodiment, the contact layers 204 include one or more signal bonding pads, where the one or more signal bonding pads are electrically isolated from the one or more ground bonding pads. For example, the one or more signal traces 230 may be electrically coupled to the one or more signal bonding pads with the one or more signal vias 232.

In another embodiment, forming the one or more substrate arrays 200 includes positioning each of the one or more column electron-optical elements 210 over a hole 201 in the composite substrate 202. In another embodiment, forming the one or more substrate arrays 200 includes bonding one or more column electron-optical elements 210 to a particular ground bonding pad of the one or more ground bonding pads and a particular signal bonding pad of the one or more signal bonding pads coupled to at least one of the top surface or the bottom surface of the composite substrate 202. For example, bonding each of the one or more column electron-optical elements 210 to the particular ground bonding pad and the particular signal bonding pad may include, but is not limited to, a soldering process, a brazing process, or an adhesion process (e.g., joining via an epoxy). By way of another example, bonding each of the one or more column electron-optical elements 210 elements to the particular ground bonding pad and the particular signal bonding pad may include an alignment process such as, but not limited to, an alignment process to align a plurality of lithographic target features or an optical overlay alignment process.

In another embodiment, at least some of the column electron-optical elements 210 are fully fabricated prior to being bonded to the particular ground bonding pad and a particular signal bonding pad. In another embodiment, at least some of the column electron-optical elements 210 (e.g. multipole beam deflectors 210) are partially fabricated via a first set of fabrication processes prior to bonding the at least some of the column electron-optical elements 210 to a particular ground bonding pad and a particular signal bonding pad, and are fully fabricated via a second set of fabrication processes after bonding the at least some of the column electron-optical elements 210 to the particular ground bonding pad and the particular signal bonding pad.

For example, the first set of fabrication processes may include boring a hole 304 based on one or more critical tolerances (e.g. a bore size and/or a bore shape) in a column electron-optical element 210, and cutting one or more slots 308 in the column electron-optical element 210. For instance, the one or more slots 308 may include a first slot 308 and at least a second slot 308. Additionally, the first slot 308 and the at least a second slot 308 may pass through a portion of the hole 304. Further, the first slot 308 and the at least a second slot 308 may not extend to the edge of the column electron-optical element 210. By way of another example, the second set of fabrication processes may include cutting the one or more slots 308 to extend to the edge of the column electron-optical element 210, such that the column electron-optical element 210 is segmented into one or more beam deflector poles (e.g. 2-12 slots segment the column electron-optical element 210 into 4-24 beam deflector poles).

In step 404, the formed substrate arrays 200 are sorted into a first substrate array assembly 120a and at least a second substrate array assembly 120b. In one embodiment, the formed substrate arrays 200 are inspected prior to being sorted into the first substrate array assembly 120a and the at least a second substrate array assembly 120b. In another embodiment, the sorting of the formed substrate arrays 200 is based on inspection results.

In step 406, a column assembly 110 is formed from the first substrate array assembly 120a and the at least a second substrate array assembly 120b. In one embodiment, the column assembly 110 includes one or more electron-optical columns 130 formed from the one or more column electron-optical elements 210 bonded to the one or more substrate arrays 200 of the first substrate array assembly 120a and the at least a second substrate array assembly 120b, as previously described herein.

In one embodiment, forming the column assembly 110 includes arranging the first substrate array assembly 120a in a first substrate array stack. In another embodiment, forming the column assembly 110 includes mounting the first substrate array stack in a first frame. In another embodiment, forming the column assembly 110 includes arranging the at least a second substrate array assembly 120b in at least a second substrate array stack. In another embodiment, forming the column assembly 110 includes mounting the at least a second substrate array assembly in at least a second frame. In another embodiment, forming the column assembly 110 includes coupling the first frame and the at least a second frame. In another embodiment, one or more alignment errors are reduced via a least square best fit alignment process when performing at least one of arranging the first substrate array assembly 120a, arranging the at least a second substrate array assembly 120b, or coupling the first frame and the at least a second frame. For example, the one or more alignment errors may include, but are not limited to, an offset distance in an x-direction, an offset distance in a y-direction, and/or an offset rotation angle.

In one embodiment, forming the column assembly 110 includes arranging the first substrate array assembly 120a in a first bonded substrate array stack. In another embodiment, forming the column assembly 110 includes arranging the at least a second substrate array assembly 120b in at least a second bonded substrate array stack. In another embodiment, forming the column assembly 110 includes bonding the first bonded substrate array stack and the at least a second bonded substrate array stack. In another embodiment, one or more alignment errors are reduced via a least square best fit alignment process when performing at least one of arranging the first substrate array assembly 120a, arranging the at least a second substrate array assembly 120b, or bonding the first bonded substrate array stack and the at least a second bonded substrate array stack. For example, the one or more alignment errors may include, but are not limited to, an offset distance in an x-direction, an offset distance in a y-direction, and/or an offset rotation angle.

In one embodiment, forming the column assembly 110 includes arranging the first substrate array assembly 120a in a first substrate array stack. In another embodiment, forming the column assembly 110 includes mounting the first substrate array stack in a frame. In another embodiment, forming the column assembly 110 includes arranging the at least a second substrate array assembly 120b in at least a second substrate array stack. In another embodiment, forming the column assembly 110 includes mounting the at least a second substrate array assembly in the same frame. In another embodiment, one or more alignment errors are reduced via a least square best fit alignment process when performing at least one of arranging the first substrate array assembly 120a or arranging the at least a second substrate array assembly 120b. For example, the one or more alignment errors may include, but are not limited to, an offset distance in an x-direction, an offset distance in a y-direction, and/or an offset rotation angle.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A substrate array comprising:
a composite substrate formed from a plurality of substrate layers, wherein the composite substrate includes a plurality of holes;
a plurality of electrical components embedded within the plurality of substrate layers;
one or more ground contact pads coupled to at least one of a top surface or a bottom surface of the composite substrate;
one or more signal contact pads coupled to at least one of the top surface or the bottom surface of the composite substrate, wherein a portion of at least one of the top surface or the bottom surface of the composite substrate is shielded with a metal contact layer to mitigate at least one of charging or cross-talk between components of the substrate array, wherein at least one of the one or more ground contact pads or the one or more signal contact pads are positioned in an unshielded portion of at least one of the top surface or the bottom surface of the composite substrate; and
a plurality of column electron-optical elements, wherein the plurality of column electron-optical elements are positioned over the plurality of holes in the composite substrate, wherein each of the plurality of column electron-optical elements includes a plurality of 3D electron optical elements bonded to at least one signal contact pad of the one or more signal contact pads or at least one ground contact pad of the one or more ground contact pads, wherein one or more of the plurality of 3D electron optical elements includes a barrel portion inserted in a hole of the plurality of holes in the composite substrate, wherein one or more of the plurality of 3D electron optical elements includes one or more grooves formed in a raised region on an outer area of a disc portion of the one or more of the plurality of 3D electron optical elements, wherein a raised region of a particular 3D electron optical element surrounds a hole of the particular 3D electron optical element, wherein the one or more grooves provide one or more work areas for one or more 3D electron optical element fabrication processes.

2. The array in claim 1, wherein the plurality of electrical components embedded within the plurality of substrate layers include at least one of one or more ground traces, one or more signal traces, one or more ground vias, or one or more signal vias.

3. The array in claim 2, wherein at least one of the one or more ground traces, the one or more ground vias, the one or more signal traces, or the one or more signal vias are embedded in the plurality of substrate layers prior to forming the composite substrate.

4. The array in claim 2, wherein the one or more ground traces are electrically coupled to the at least one ground contact pad with the one or more ground vias.

5. The array in claim 2, wherein the one or more signal traces are electrically coupled to the at least one signal contact pad with the one or more signal vias.

6. The array in claim 1, wherein the composite substrate is formed from the plurality of substrate layers via at least one of pressing together the plurality of substrate layers, sintering together the plurality of substrate layers, or joining together the plurality of substrate layers via a co-firing process.

7. The array in claim 1, wherein at least some of the plurality of substrate layers are comprised of a co-fired ceramic.

8. The array in claim 1, wherein at least some of the at least one ground contact pad or the at least one signal contact pad is within a metalized coating or a metal plate.

9. The array in claim 1, wherein the at least one ground contact pad or the at least one signal contact pad is coupled to at least one of the top surface or the bottom surface of the composite substrate via at least one of a pressing process, a sintering process, an adhesion process, a thick-film process, or a thin-film process.

10. The array in claim 1, wherein at least some of the plurality of column electron-optical elements are fully fabricated via the one or more fabrication processes prior to being bonded to a particular ground contact pad and a particular signal contact pad.

11. The array in claim 1, wherein the one or more fabrication processes include a plurality of fabrication processes, wherein at least some of the plurality of column electron-optical elements are partially fabricated via a first set of fabrication processes of the plurality of fabrication processes prior to bonding the at least some of the plurality of column electron-optical elements to a particular ground contact pad and a particular signal contact pad, wherein the at least some of the plurality of column electron-optical elements are fully fabricated via a second set of fabrication processes of the plurality of fabrication processes after bonding the at least some of the plurality of column electron-optical elements to the particular ground contact pad and the particular signal contact pad.

12. The array in claim 11, wherein the first set of fabrication processes includes:
a boring process, wherein the boring process generates a hole based on at least one critical tolerance in the at least some of the plurality of column electron-optical elements; and
a cutting process, wherein the cutting process generates a plurality of slots in the at least some of the plurality of column electron-optical elements, wherein the plurality of slots include a first slot and at least a second slot, wherein the first slot and the at least a second slot pass through a portion of the hole, wherein the first slot and the at least a second slot do not extend to the edge of the column electron-optical element.

13. The array in claim 12, wherein the at least one critical tolerance includes at least one of a bore size or a bore shape.

14. The array in claim 12, wherein the second set of fabrication processes includes:
a cutting process, wherein the cutting process extends the plurality of slots to the edge of the at least some of the plurality of column electron-optical elements.

15. The array in claim 14, wherein the number of a plurality of beam deflector poles ranges from 4 beam deflector poles to 24 beam deflector poles.

16. The array in claim 1, wherein bonding the plurality of column electron-optical element to the particular ground contact pad and the particular signal contact pad includes at least one of a soldering process, a brazing process, or an adhesion process.

17. The array in claim 1, wherein the plurality of column electron-optical elements are inspected prior to being bonded to the particular ground contact pad and the particular signal contact pad.

18. The array in claim 1, wherein the plurality of column electron-optical elements are aligned via an aligning process while being bonded to the particular ground contact pad and the particular signal contact pad, wherein the aligning process includes at least one of aligning a plurality of lithographic target features or an optical overlay alignment process.

19. A substrate array comprising:
a composite substrate formed from a plurality of substrate layers, wherein the composite substrate includes a plurality of holes;
a plurality of electrical components embedded within the plurality of substrate layers;
one or more ground contact pads coupled to at least one of a top surface or a bottom surface of the composite substrate;
one or more signal contact pads coupled to at least one of the top surface or the bottom surface of the composite substrate, wherein a portion of at least one of the top surface or the bottom surface of the composite substrate is shielded with a metal contact layer to mitigate at least one of charging or cross-talk between components of the substrate array, wherein at least one of the one or more ground contact pads or the one or more signal contact pads are positioned in an unshielded portion of at least one of the top surface or the bottom surface of the composite substrate; and
a plurality of column electron-optical elements, wherein the plurality of column electron-optical elements are positioned over the plurality of holes in the composite substrate, wherein each of the plurality of column electron-optical elements includes a plurality of 3D electron optical elements bonded to at least one signal contact pad of the one or more signal contact pads or at least one ground contact pad of the one or more ground contact pads, wherein one or more of the plurality of 3D electron optical elements includes a barrel portion inserted in a hole of the plurality of holes in the composite substrate, wherein one or more of the plurality of 3D electron optical elements includes one or more grooves formed in a raised region on an outer area of a disc portion of the one or more of the plurality of 3D electron optical elements, wherein the raised region offsets an inner area of the disc portion from the at least one signal contact pad of the one or more signal contact pads or the at least one ground contact pad of the one or more ground contact pads at a distance dependent on a height of the raised region.

* * * * *